(12) United States Patent
So

(10) Patent No.: US 7,838,987 B2
(45) Date of Patent: Nov. 23, 2010

(54) ELECTRONIC DEVICE, STANDOFF MEMBER, AND METHOD OF MANUFACTURING ELECTRONIC DEVICE

(75) Inventor: Tsuyoshi So, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/132,193

(22) Filed: May 19, 2005

(65) Prior Publication Data
US 2006/0192293 A1 Aug. 31, 2006

(30) Foreign Application Priority Data
Feb. 25, 2005 (JP) ............................ 2005-051321

(51) Int. Cl.
*H01L 23/34* (2006.01)
(52) U.S. Cl. .................. 257/718; 257/719; 257/726; 257/778; 257/E21.503; 257/E21.511; 438/108; 438/117; 438/122
(58) Field of Classification Search ................ 438/108, 438/117, 118, 121, 122; 257/778, 687, 704, 257/706, 711, 722, 718, 719, 720, 726, E21.503, 257/E21.511
See application file for complete search history.

(56) References Cited

U.S. PATENT DOCUMENTS

| | | | | |
|---|---|---|---|---|
| 5,136,366 | A * | 8/1992 | Worp et al. .................. 257/687 |
| 6,282,095 | B1 * | 8/2001 | Houghton et al. ........... 361/704 |
| 6,304,450 | B1 * | 10/2001 | Dibene et al. ................ 361/704 |
| 6,395,991 | B1 * | 5/2002 | Dockerty et al. ............. 174/252 |
| 6,460,170 | B1 * | 10/2002 | Shaeffer et al. ................ 716/15 |
| 6,594,151 | B2 * | 7/2003 | Dixon et al. .................. 361/753 |
| 6,850,411 | B1 * | 2/2005 | Patel ........................... 361/704 |
| 6,941,537 | B2 * | 9/2005 | Jessep et al. .................... 716/15 |
| 7,598,124 | B2 * | 10/2009 | Odegard ....................... 438/117 |
| 2001/0032738 | A1 * | 10/2001 | Dibene et al. ................ 174/260 |
| 2003/0145460 | A1 | 8/2003 | Jessep et al. |
| 2004/0134680 | A1 | 7/2004 | Dai et al. |

FOREIGN PATENT DOCUMENTS

| | | |
|---|---|---|
| EP | 0 248 566 | 12/1987 |
| JP | 9-213743 | 8/1997 |
| JP | 10-13012 | 1/1998 |
| JP | 11-163044 | 6/1999 |
| JP | 2003-31751 | 1/2003 |

OTHER PUBLICATIONS

Kazuo et al., Japan Publication 11-163044 (English Translation) Printed Wiring Board and Method for Mounting Electronic Parts, (Jun. 18, 1999).*

(Continued)

*Primary Examiner*—Khiem D Nguyen
(74) *Attorney, Agent, or Firm*—Staas & Halsey LLP

(57) ABSTRACT

An electronic device comprises a semiconductor device having a package substrate with bumps. The semiconductor device is bonded to a mounting substrate by flip-chip bonding. A standoff member supports the package substrate on the mounting substrate with a predetermined standoff between the package substrate and the mounting substrate. The standoff member comprises a hole provided in the mounting substrate, an insertion portion provided to be contained in the hole, and a standoff portion provided to contact and support the package substrate such that the standoff portion has a height, equivalent to the predetermined standoff, on the mounting substrate and enables relative displacement of the package substrate to the mounting substrate.

14 Claims, 5 Drawing Sheets

OTHER PUBLICATIONS

European Search Report issued in corresponding European Patent Application No. 05 25 3087, mailed Oct. 17, 2007.

Office Action issued in corresponding Japanese Patent Application No. 2005-051321, mailed on Jan. 8, 2008.

* cited by examiner

ELECTRONIC DEVICE, STANDOFF MEMBER, AND METHOD OF MANUFACTURING ELECTRONIC DEVICE

CROSS-REFERENCE TO RELATED APPLICATION

This application is based upon and claims the benefit of priority of Japanese Patent Application No. 2005-051321, filed on Feb. 25, 2005, the entire contents of which are herein incorporated by reference.

BACKGROUND OF THE INVENTION

1. Field of the Invention

The present invention generally relates to an electronic device, a standoff member, and an electronic-device manufacturing method. More particularly, the present invention relates to an electronic device having the structure in which a semiconductor device and a mounting substrate are bonded together by flip-chip bonding with a predetermined standoff therebetween, and a method of manufacturing the electronic device.

2. Description of the Related Art

FIG. 1 shows the outline composition of a conventional electronic device 1. The conventional electronic device 1 of FIG. 1 generally contains the semiconductor device 2, the system board 3, and the heat sink 4.

The semiconductor device 2 has a BGA (ball grid array) type package structure and comprises the semiconductor chip 5, the package substrate 6, the lid 7, and the bumps 8. The flip-chip bonding of the semiconductor chip 5 is performed on the top surface of the package substrate 6.

Moreover, the plurality of bumps 8 are arranged on the bottom surface of the package substrate 6. The package substrate 6 is the multi-layer substrate and functions as an interposer which electrically connects the bumps 8 on the bottom surface of the package substrate 6 to the semiconductor chip 5 on the top surface of the package substrate 6.

Moreover, the lid 7 is arranged on the top surface of the package substrate 6 on which the semiconductor chip 5 is carried in order to protect the semiconductor chip 5 from dusts or damage.

Furthermore, the bumps 8 (solder balls) are arranged on the bottom surface of the package substrate 6, and the package substrate 6 is soldered to the system board 3 via the bumps 8. Thereby, the flip-chip bonding of the semiconductor device 2 to the system board 3 is formed.

On the other hand, the heat sink 4 is formed in order to dissipate the heat generated by the semiconductor chip 5 into the atmosphere. The semiconductor device 2 mentioned above is arranged on the top of the base 13, and the heat sink 4 is arranged on the top of the lid 7 through the heat transfer material 9.

The heat sink 4 is pressed onto the base 13 by the springs 10, so that the heat sink 4 contacts the lid 7 firmly under pressure. Therefore, thermal conduction of the heat generated by the semiconductor chip 5 to the heat sink 4 readily occurs through the lid 7 and the heat transfer material 9, and the heat sink 4 dissipates the heat into the atmosphere effectively.

In recent years, the quantity of the heat generated by the semiconductor chip 5 is increasing on a yearly basis with the improvement in the performance of the electronic system on which the electronic device 1 is carried. In order to improve the cooling performance, the size expansion of the heat sink 4, the material change of the heat sink 4 (for example, aluminum is changed to copper), etc. have been achieved. In connection with this, the weight of the heat sink 4 is increasing and the loading force of the springs 10 to press the heat sink 4 onto the semiconductor device 2 firmly is also increasing.

Thus, the difficulty arises in that the bumps 8 (solder balls) receive the increased weight of the heat sink 4, and the increased loading force of the springs 10, and fracture of the bumps 8 may occur if all the weight and the loads are impressed on the bumps 8.

Even though the fracture does not occur, deformation of the bumps 8 may occur, and the clearance between the system board 3 and the package substrate 6 becomes too narrow and uneven. In such circumstances, the deformation of the bumps 8 will cause a short circuit between the adjoining bumps 8.

Hereinafter, the clearance between the system board (mounting substrate) and the package substrate will be referred to as the standoff.

To obviate the above problem, arranging a standoff member (spacer) between the system board 3 and the package substrate 6 is known.

FIG. 2 shows the bonded portion between the system board 3 and the package substrate 6 in the conventional electronic device 1 of FIG. 1 in the vicinity of the standoff member.

In the conventional example of FIG. 2, the standoff member 11 is soldered to the package substrate 6 through the solder 12. The predetermined standoff is formed between the system board 3 and the package substrate 6 by this standoff member 11.

The weight of the heat sink 4 and the loading force of the springs 10 can be received by the standoff member 11 mainly, and the use of the standoff member 11 enables the force impressed to the bumps 8 to be reduced. For this reason, it is possible to prevent the deformation or fracture of the bumps 8, and, therefore, the package substrate 6 and the system board 3 can be electrically connected safely.

Moreover, the standoff member is not restricted to the composition shown in FIG. 1 and FIG. 2, and standoff members in various kinds of composition have been proposed.

Specifically, Japanese Laid-Open Patent Application No. 10-013012 discloses an example of the standoff member which employs a resin spacer provided between a semiconductor device and a system board (mounting substrate). Moreover, Japanese Laid-Open Patent Application No. 09-213743 discloses a spacer portion (standoff member) which defines a predetermined standoff between a semiconductor device and a wiring substrate, and this spacer portion is inserted in the positioning hole of the semiconductor device and the positioning hole of the wiring substrate in common. The spacer portion is arranged approximately in the center of the positioning pins which are provided for positioning of the semiconductor device and the wiring substrate.

In the conventional technology of FIG. 1 and FIG. 2, the standoff member 11 is fixedly soldered to the package substrate 6 by the solder 12. For this reason, it is necessary to improve the soldering wettability of the soldering surface of the standoff member 1. The surface treatment, such as Au plating, is required for the surface of the standoff member 11 confronting the solder 12 for this purpose, which causes the manufacturing cost to increase.

Moreover, the material and configuration of the standoff member 11 are different from those of the bumps 8, and there is the problem in that special consideration must be taken to the positioning and handling of the standoff member 11 and the bumps 8, which causes the efficiency of manufacture of the electronic device 1 to fall.

On the other hand, in the method of Japanese Laid-Open Patent Application No. 10-013012, the resin spacer is used as the standoff member. For this reason, additional equipment for filling the resin in the space between the semiconductor device and the mounting board is required, which causes the equipment and facility cost to increase.

Moreover, in order to cure the resin, additional heat-treatment is required. Since the height of the resin spacer on the mounting board just after the filling of the resin is completed is still uneven, the leveling procedure is also needed. Therefore, the use of the resin spacer will make the manufacturing processes complicated.

Furthermore, in the method of Japanese Laid-Open Patent Application No. 09-213743, the positioning of the semiconductor device and the wiring substrate is performed with the positioning pins in which the spacer portion (standoff member) is provided. For this reason, it is necessary to carry out the machining of the positioning pins and the positioning holes with high precision. The preparation of such positioning pins and holes is difficult and troublesome, and the manufacturing cost will be raised.

SUMMARY OF THE INVENTION

An object of the present invention is to provide an improved standoff member used in an electronic device in which the above-mentioned problems are eliminated.

Another object of the present invention is to provide an electronic device, a standoff member, and an electronic-device manufacturing method in which the package substrate and the mounting substrate can be supported with the predetermined standoff using a simple and inexpensive composition.

In order to achieve the above-mentioned objects, the present invention provides an electronic device comprising: a semiconductor device having a package substrate with bumps; a mounting substrate to which the semiconductor device is bonded by flip-chip bonding; and a standoff mechanism supporting the package substrate on the mounting substrate with a predetermined standoff between the package substrate and the mounting substrate, wherein the standoff mechanism is provided with a standoff member which comprises: a hole provided in the mounting substrate; an insertion portion provided to be contained in the hole; and a standoff portion provided to contact and support the package substrate such that the standoff portion has a height, equivalent to the predetermined standoff, on the mounting substrate and enables relative displacement of the package substrate to the mounting substrate.

According to the present invention, the standoff between the package substrate and the mounting substrate can be maintained at the predetermined clearance. What is needed is just to insert the insertion portion of the standoff member into the hole of the mounting substrate and dispose the package substrate so as to contact the standoff portion.

For this reason, the fixing member for fixing the standoff member and the package substrate as required in the conventional method is no longer necessary, and reduction of the number of the required parts is possible.

Moreover, since it is unnecessary to prepare the standoff member with a selected material which is suitable for the soldering, the flexibility at the time of choosing the material of the standoff member can be increased.

The above-mentioned electronic device may be configured so that the standoff portion has a flat, smooth contact surface which contacts the package substrate. According to the present invention, the package substrate is in the state where the package substrate can be displaced to the standoff member, so that relative displacement of the semiconductor device to the mounting substrate is possible. For this reason, it is expected that the self-alignment of the semiconductor device occurs by the surface tension generated when the bumps are fused at the time of flip-chip bonding of the semiconductor device to the mounting substrate. Therefore, positioning of the semiconductor device and the mounting substrate can be performed easily and with high precision, without providing the additional positioning mechanism etc. at the time of flip-chip bonding.

Moreover, the above-mentioned electronic device may be configured so that the insertion portion has a tapered portion at a leading edge of the insertion portion. According to the present invention, the standoff member having the tapered portion at the leading edge of the insertion portion can be easily inserted in the hole of the mounting substrate.

Moreover, the above-mentioned electronic device may be configured so that the semiconductor device has a BGA type structure. The above-mentioned electronic device may be configured so that a pressing member is disposed at an upper part of the semiconductor device to press the semiconductor device onto the mounting substrate.

Moreover, in order to achieve the above-mentioned objects, the present invention provides a standoff member which supports a package substrate, constituting a semiconductor device, on a mounting substrate with a predetermined standoff between the package substrate and the mounting substrate, comprising: a hole provided in the mounting substrate; an insertion portion provided to be contained in the hole; and a standoff portion provided to contact and support the package substrate such that the standoff portion has a height, equivalent to the predetermined standoff, on the mounting substrate and enables relative displacement of the package substrate to the mounting substrate.

According to the present invention, the standoff member has a simple composition which includes the insertion portion and the standoff portion, and the productivity is good and reduction of the manufacturing cost is possible.

In order to achieve the above-mentioned objects, the present invention provides a method of manufacturing an electronic device in which a semiconductor device is bonded to a mounting substrate with a predetermined standoff between a package substrate of the semiconductor device and the mounting substrate, the method comprising the steps of: providing a standoff member which comprises a hole provided in the mounting substrate, an insertion portion provided to be contained in the hole; and a standoff portion provided to contact and support the package substrate such that the standoff portion has a height, equivalent to the predetermined standoff, on the mounting substrate and enables relative displacement of the package substrate to the mounting substrate; inserting the standoff member into the hole of the mounting substrate; disposing the package substrate on the mounting substrate so that the package substrate contacts the standoff portion of the standoff member; and performing a heating process with the standoff member interposed between the package substrate and the mounting substrate so that the semiconductor device is bonded to the mounting substrate by flip-chip bonding.

According to the present invention, the processing which carries out flip-chip bonding of the semiconductor device and the mounting substrate can be performed easily, and the standoff between the package substrate and the mounting substrate can be maintained at the predetermined level stably.

BRIEF DESCRIPTION OF THE DRAWINGS

Other objects, features and advantages of the present invention will be apparent from the following detailed description when read in conjunction with the accompanying drawings.

DETAILED DESCRIPTION OF PREFERRED EMBODIMENTS

A description will now be given of the preferred embodiments of the present invention with reference to the accompanying drawings.

Figure 1:
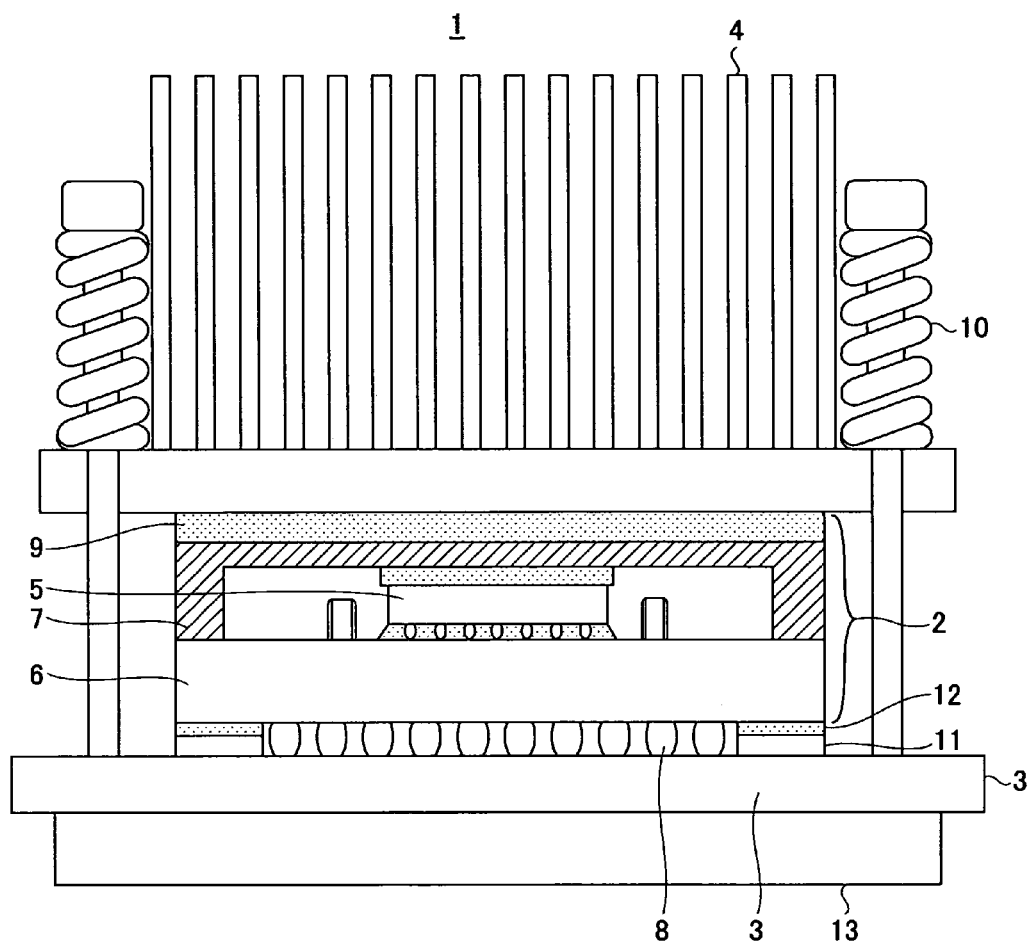
FIG. 1 is a diagram showing the composition of the conventional electronic device.
Figure 2:
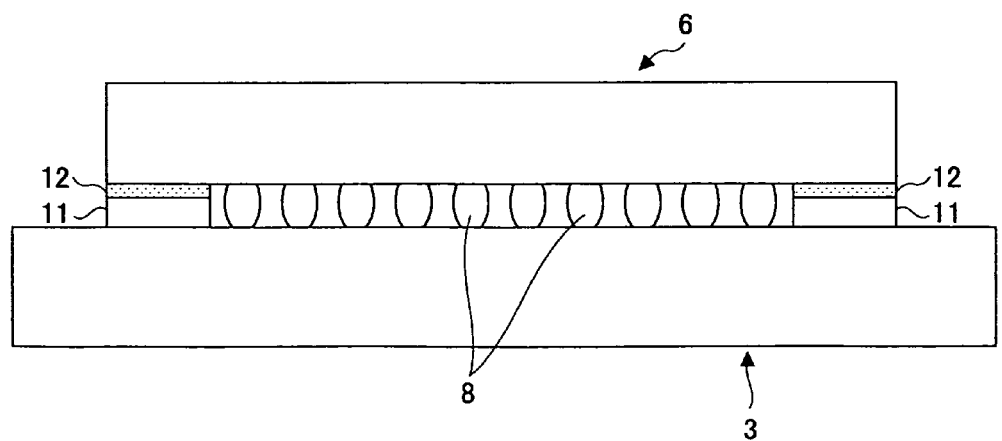
FIG. 2 is a diagram showing a portion of the conventional electronic device in the vicinity of the standoff member.
Figure 3:
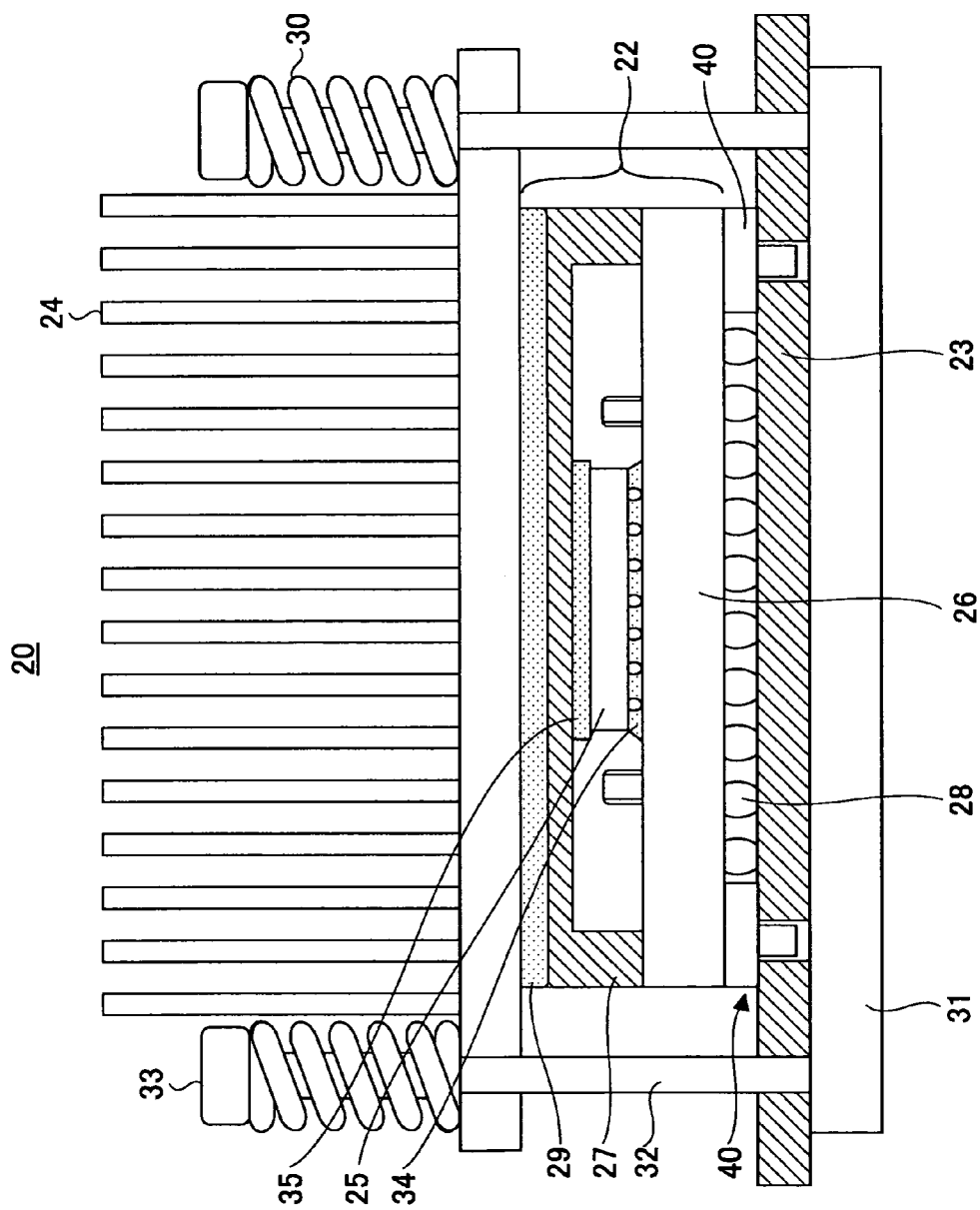
FIG. 3 is a diagram showing the composition of the electronic device in one preferred embodiment of the invention.

FIG. 3 shows the composition of the electronic device 20 in the preferred embodiment of the invention.

The electronic device 20 of FIG. 3 comprises the semiconductor device 22, the system board 23 (the mounting substrate), the heat sink 24, and the standoff mechanism 40.

The semiconductor device 22 is has a BGA (ball grid array) type package structure and comprises the semiconductor chip 25, the package substrate 26, the lid 27, and the bumps 28.

The semiconductor chip 25 operates at the accelerated rate and a large mount of heat is generated during operation. The flip-chip bonding of the semiconductor chip 25 is formed on the top surface of the package substrate 26. Furthermore, the under-fill resin 34 is disposed between the semiconductor chip 25 and the package substrate 26 where the flip-chip bonding is formed, in order to raise the bonding reliability.

Moreover, the lid 27 is disposed on the surface on which the semiconductor chip 25 of the package substrate 26 is carried, in order to protect the semiconductor chip 25 from dusts or damage. The lid 27 is formed from the metal with a high thermal conductivity, and this lid 27 is soldered to the package substrate 26. The heat transfer material 35 is disposed between the top surface of the lid 27 and the top surface of the semiconductor chip 25, and, therefore, the thermal conduction between the semiconductor chip 25 and the lid 27 is possible.

The bumps 28 (formed of solder balls) are arranged on the bottom surface of the package substrate 26. This bottom surface of the package substrate 26 confronts the system board 23. The package substrate 26 is the multi-layer substrate and functions as an interposer which electrically connects the bumps 28 on the bottom of the package substrate 26 to the semiconductor chip 25 on the top of the package substrate 26.

The bumps 28 are arranged on the bottom surface of the package substrate 26 in a matrix formation except for the position where the standoff mechanism 40 (which will be mentioned later) is disposed. That is, the bottom surface of the package substrate 26 at the position corresponding to the arrangement position of the standoff mechanism 40 is made into a flat and smooth surface.

On the other hand, the heat sink 24 is provided in order to dissipate the heat generated by the semiconductor chip 25. This heat sink 24 is attached to the semiconductor device 22 by the attachment mechanism. The attachment mechanism comprises the springs 30, the base 31, the shafts 32, and the fastening nuts 33.

The shafts 32 are formed on the base 31 in the upright condition, and these shafts 32 are inserted in the through holes which are formed in the heat sink 24 at the corresponding positions.

In order to attach the heat sink 24 to the semiconductor device 22, the semiconductor device 22 is disposed on the base 31, and thereafter, the heat sink 24 is fitted to the shafts 32. At this time, the heat transfer material 29 is disposed beforehand on the top surface of the lid 27 which constitutes part of the semiconductor device 22.

And when the heat sink 24 contacts the semiconductor device 22 through the lid 27 and the heat transfer material 29, the springs 30 are attached to the shafts 32 which extending upward from the heat sink 24, and the fastening nuts 33 are secured to the upper ends of the shafts 32 which are threaded beforehand.

Accordingly, the heat sink 24 is pressed onto the base 31 by the springs 30 so that the heat sink 24 contacts the semiconductor device 22 firmly through the lid 27 and the heat transfer material 29. Thus, thermal conduction of the heat generated in the semiconductor chip 25 to the heat sink 24 readily occurs through the lid 27 and the heat transfer material 29, and the heat sink 24 dissipates the heat of the semiconductor chip 25 effectively.

In recent years, the quantity of the heat generated by the semiconductor chip 25 is increasing. In order to improve the cooling performance, the size expansion of the heat sink 24, the material change of the heat sink 24 (for example, aluminum is changed to copper), etc. have been achieved. In connection with this, the weight of the heat sink 24 is increasing and the loading force of the springs 30 to press the heat sink 24 onto the semiconductor device 20 is also increasing.

To avoid the problem that all the weight of the heat sink 24 and the loads of the springs 30 are impressed on the bumps 28 (solder balls), the standoff mechanism 40 is used in this embodiment in order to support the package substrate 26 on the system board 23.

Next, the composition of the standoff mechanism 40 will be explained.

Figure 4:
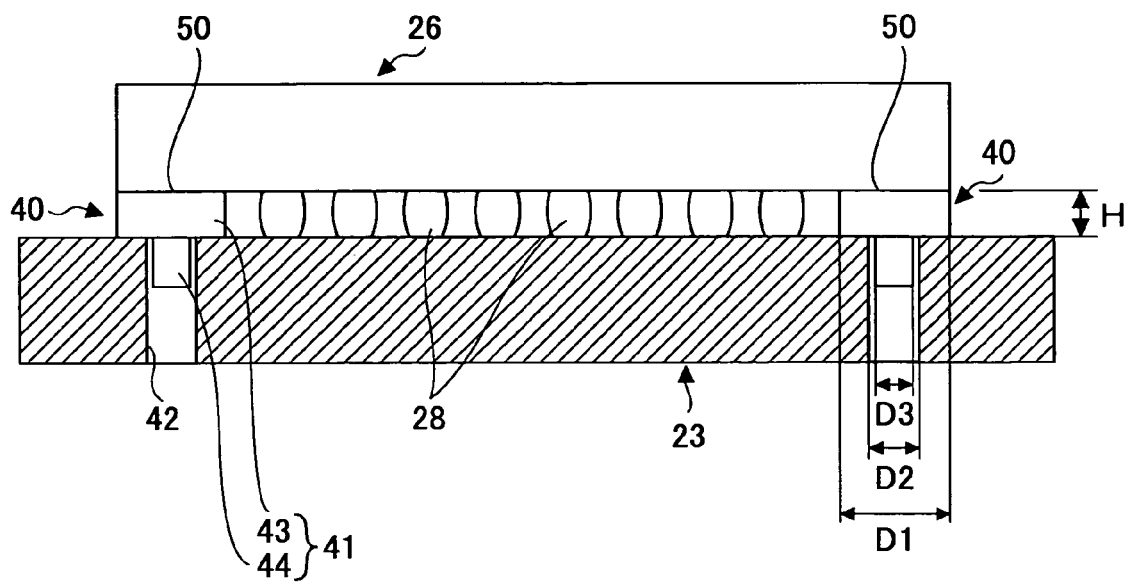
FIG. 4 is a diagram showing a portion of the electronic device of the present embodiment in the vicinity of the standoff mechanism.

FIG. 4 shows the bonded portion between the system board 23 and the package substrate 26 in the electronic device 20 of FIG. 3 in the vicinity of the standoff mechanism 40.

As shown in FIG. 4, the package substrate 26 (the semiconductor device 22) is supported by the standoff mechanism 40 on the system board 23. And this standoff mechanism 40 forms a predetermined standoff between the system board 23 and the package substrate 26. The predetermined standoff means the clearance indicated by the arrow H in FIG. 4.

Accordingly, the weight of the heat sink 24 and the loading force of the springs 30 are mainly received by the standoff mechanism 40, and the force impressed to the bumps 28 can be reduced by the standoff mechanism 40. This makes it possible to prevent the deformation or fracture of the bumps 28, and, therefore, the electrical connection of the system board 23 and the package substrate 26 can be made stable.

The standoff mechanism 40 described above comprises the standoff member 41, and the hole 42 formed in the system board 23.

The material of the standoff member 41 may be the material which can receive the weight of the heat sink 24 and the loading force of the springs 30. It is not limited to a special material, and a metal (for example, aluminum or copper), a resin, ceramics, etc. can be used for the material of the standoff member 41.

The standoff member 41 in this embodiment comprises the standoff portion 43 and the insertion portion 44 which are formed integrally.

The standoff portion 43 is configured in the disc-like form, and the height of the standoff portion 43 on the system board 23 is set to be equal to the predetermined standoff H mentioned above.

The contact surface 50 formed on the top surface of the standoff portion 43 is the surface which comes in contact with the bottom surface of the package substrate 26, and this surface is made into a flat and smooth surface.

Moreover, the insertion portion 44 has the cylindrical configuration, and this insertion portion 44 is formed so that it extend in the lower part from the bottom surface of the standoff portion 43 in same axle with the standoff portion 43. The diameter $D3$ of this insertion portion 44 the diameter $D1$ of the standoff portion 43, and it is set as the size smaller than the diameter $D2$ of the hole 42.

Moreover, the diameter $D1$ of the standoff portion 43 is greater than the diameter $D2$ of the hole 42 which is greater than the diameter $D3$ of the insertion portion 44 ($D1>D2>D3$).

Figure 5A:
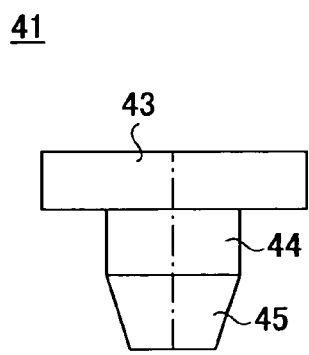
FIG. 5A and FIG. 5B are diagrams showing the standoff member in the electronic device of the present embodiment.
Figure 5B:
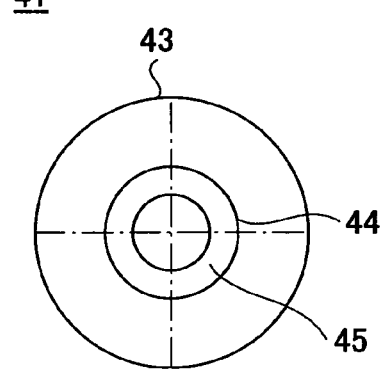

Under the present circumstances, the standoff shown in FIG. 5A and FIG. 5B has a tapered portion 45 at the leading edge (lower end) of the insertion portion 44 so that the standoff member 41 insertion into the hole 42 can be performed easily.

Figure 6A:
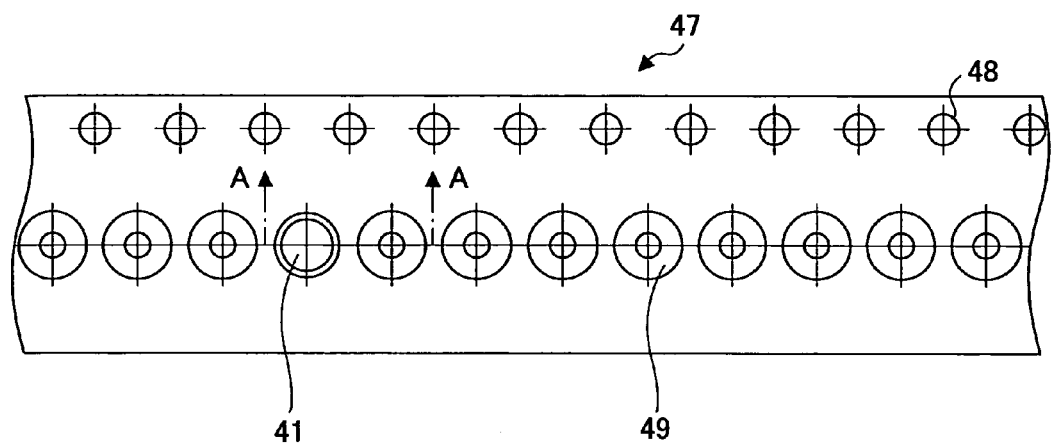
FIG. 6A and FIG. 6B are diagrams for explaining the state in which the standoff member is contained in the embossed tape.
Figure 6B:
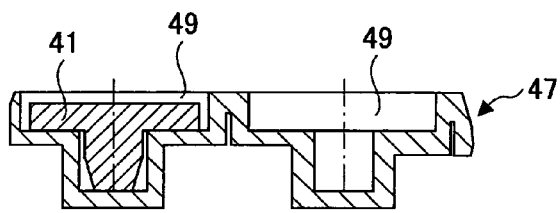

Moreover, the standoff member 41 is the easy composition that the pillar-like insertion portion 44 extended on the bottom surface of the standoff portion 43 of disk form, and the standoff member 41 may be contained in and conveyed on the embossed tape 47 as shown in FIG. 6A and FIG. 6B.

FIG. 6A is a plan view of the embossed tape 47, and FIG. 6B is a cross-sectional view of the embossed tape 47 taken along the line A-A in FIG. 6A.

As shown in FIG. 6B, the recess 49 is formed in the embossed tape 47, and the standoff member 41 can be contained in the recess 49.

In addition, the portion on the left-hand side of FIG. 6B shows the state where the standoff member 41 is contained, and the right-hand side portion shows the state where the standoff member 41 is not contained.

Usually, the cover tape (not shown) is attached to the top surface of the embossed tape 47, and separation of the standoff member 41 is prevented.

The standoff member 41 concerning this embodiment is the easy configuration that the pillar-like insertion portion 44 extends from the bottom surface of the standoff portion 43 of disk form as mentioned above.

For this reason, after containing the standoff member 41 on the embossed tape 47, it became possible to stick the cover tape, and it enabled this to use the embossed tape 47 for conveyance procedure of the standoff member 41.

The embossed tape is widely used for the automatic mounting process of carrying the electronic parts on the substrate automatically in the semiconductor manufacturing processes. Since the standoff member 41 is configured so that it can be contained in the embossed tape 47, the procedure to insert the standoff member 41 in the hole 42 of the system board 23 can be automated. Accordingly, the efficiency of manufacture of the electronic device 20 can be increased.

Next, with reference to FIG. 7 through FIG. 9, the manufacturing method of the electronic device 20 using the standoff mechanism 40 will be explained.

In the present embodiment, the manufacturing method of the electronic device 20 uses the standoff mechanism 40 on the system board 23, and the flip-chip bonding of the package substrate 26 is performed with the standoff mechanism 40 disposed, so that the predetermined standoff is formed. Other steps of the manufacture method in the present embodiment are essentially the same as those of the conventional manufacturing methods.

For this reason, in the following explanation, only the steps of assembling the electronic device 20 with the standoff mechanism 40 will be described, and a description of the other steps of the manufacturing method will be omitted.

Figure 7:
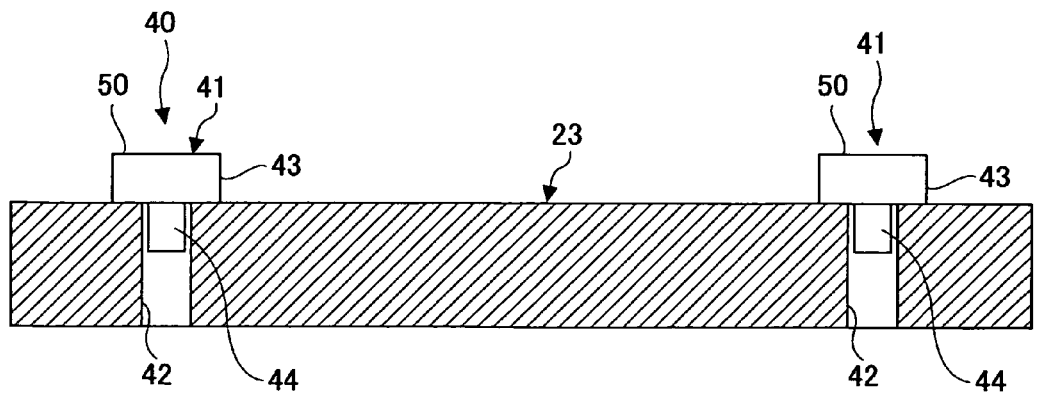
FIG. 7 is a diagram for explaining the procedure to attach the standoff member to the system board in the electronic-device manufacturing method in one preferred embodiment of the invention.

In order to arrange the package substrate 26 on the system board 23 using the standoff mechanism 40, the standoff member 41 which constitutes part of the standoff mechanism 40 is inserted in the hole 42 which is formed beforehand in the system board 23, as shown in FIG. 7.

Specifically, the system board 23 is equipped with the standoff member 41 by inserting the insertion portion 44 of the standoff member 41 in the hole 42.

Under the present circumstances, it is only inserting in the hole 42 and the insertion portion 44 does not perform adhesion etc.

For this reason, the number of the required parts does not increase and the insertion procedure is easy to be performed, and the manufacturing cost can be reduced.

Moreover, as described above, by using the embossed tape 47, the procedure to insert the standoff member 41 in the hole 42 can also be automated, and manufacture efficiency can be further raised in this case.

Furthermore, it is not necessary to position the standoff member 41 to the system board 23. For this reason, in the state which fitted in loosely to the hole 42 is sufficient as the insertion portion 44, and therefore, even if the size accuracy of the diameter $D2$ of the hole 42 and the diameter $D3$ of the insertion portion 44 is comparatively low, it can be managed by it.

Thus, the machining of the hole 42 and the insertion portion 44 can be performed easily, and improvement and cost reduction of manufacture efficiency can be aimed at.

If the system board 23 is equipped with the standoff member 41, the package substrate 26 (semiconductor device 22) will be continuously laid on the system board 23.

Figure 8:
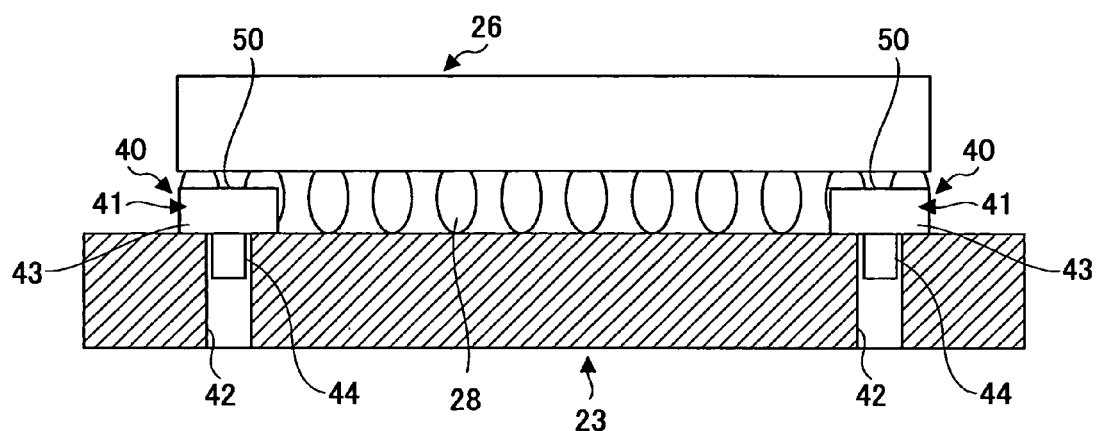
FIG. 8 is a diagram for explaining the procedure to dispose the package substrate on the standoff member attached to the system board in the electronic-device manufacturing method of the present embodiment.

FIG. 8 shows the state in which the package substrate 26 is disposed on the system board 23.

Next, after the standoff member 41 is interposed between the package substrate 26 and the system board 23, the reflow processing is performed, and flip-chip bonding of the package substrate 26 is carried out by fusing the bumps 28 at the system board 23.

In addition, the material which the standoff member 41 does not transform with the heat by the reflow processing is selected. If the bumps 28 are fused at the time of the reflow processing, the package substrate 26 will contact the contact surface 50 of the standoff member 41 by prudence of the semiconductor device 22.

Since this contact surface 50 is the flat and smooth surface as described above, in the state where the package substrate 26 contacted the contact surface 50, the package substrate 26 will be in the state where it can be displaced on the contact surface 50 (the standoff portion 43).

On the other hand, when the surface tension occurs by the fusing of the bumps 28, the package substrate 26 by itself acts to move to the center of the electrodes (not shown) formed on the system board 23 corresponding to the bumps 28. This action is called the self-alignment action.

Therefore, the package substrate 26 moves to the system board 23 by this self-alignment action, so that the system board 23 and the package substrate 26 can be positioned, without the need for providing additional positioning mechanism or the like. Thus, the positioning of the system board 23 and the package substrate 26 can be performed easily with high precision by using the manufacture method of the present embodiment.

Figure 9:
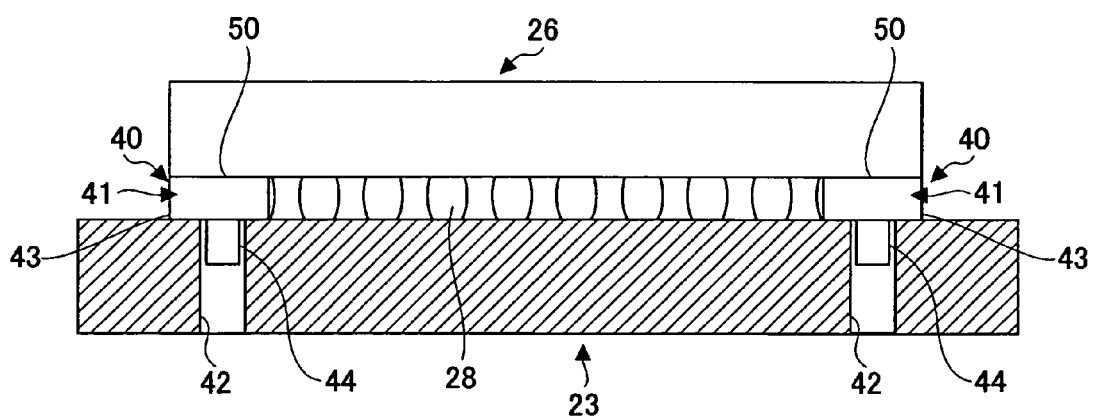
FIG. 9 is a diagram for explaining the procedure to perform the reflow processing in the electronic-device manufacturing method of the present embodiment.

In addition, FIG. 9 shows the state in which the reflow processing is completed.

As described above, in the manufacture method of this embodiment, the standoff member 41 is inserted in the hole 42 of the system board 23 and the package substrate 26 is disposed on the upper part of the standoff member 41, and thereafter, the flip-chip bonding of the package substrate 26 is carried out to the system board 23 through the reflow processing.

For this reason, while the standoff H between the system board 23 and the package substrate 26 is maintained at the predetermined level, the flip-chip bonding of the package substrate 26 (the semiconductor device 22) can be carried out in the state in which the package substrate 26 is positioned with high precision on the system board 23.

Moreover, when bonding the package substrate 26 to the system board 23, the soldering processing as needed in the conventional method is no longer necessary, and simplification of the manufacturing procedure of the electronic device 20 is possible.

Moreover, since it is unnecessary to prepare the standoff member 41 with a selected material which is suitable for the soldering, the flexibility at the time of choosing the material of the standoff member 41 can be increased.

The present invention is not limited to the above-described embodiments, and variations and modifications may be made without departing from the scope of the present invention.

What is claimed is:

1. An electronic device comprising:
    a semiconductor device having a package substrate with solder bumps on a bottom surface of the package substrate;
    a mounting substrate, having a plurality of holes, to which the semiconductor device is bonded by flip-chip bonding; and
    a plurality of mutually isolated standoff members supporting the package substrate on the mounting substrate with a predetermined standoff between the package substrate and the mounting substrate, wherein each of the plurality of mutually isolated standoff members comprising:
    an insertion portion inserted in one of the plurality of holes in the mounting substrate; and
    a standoff portion to contact and support the package substrate such that the standoff portion has a height, equivalent to the predetermined standoff, on the mounting substrate and enables displacement of the package substrate relative to the mounting substrate,
    wherein the plurality of mutually isolated standoff members are arranged separately from the semiconductor device and the insertion portion and the standoff portion are integrally formed and a diameter of the standoff portion which contacts the package substrate is larger than a diameter of one of the plurality of holes in the mounting substrate; and
    wherein the standoff portion of each standoff member has a flat and smooth surface that contacts against the bottom surface of the package substrate and supports the package substrate so as to allow the package substrate horizontally movable when the solder bumps are fused.

2. The electronic device according to claim 1, wherein the insertion portion has a tapered portion at a leading edge of the insertion portion.

3. The electronic device according to claim 1, wherein the semiconductor device has a BGA type structure.

4. The electronic device according to claim 1, wherein a pressing member is disposed at an upper part of the semiconductor device to press the semiconductor device onto the mounting substrate.

5. An electronic device according to claim 1, wherein:
    the insertion portion is insertable by axial sliding movement into the hole and establishes a fixed height equivalent to the pre-determined standoff.

6. The electronic device according to claim 1, wherein the package substrate can be displaced laterally relative to the standoff portion of each standoff member.

7. The electronic device according to claim 1, wherein the package substrate slides on the flat and smooth surface of the standoff portion of each standoff member.

8. A plurality of mutually isolated standoff members and which support a package substrate, constituting a semiconductor device having a package substrate with solder bumps on a bottom surface of the package substrate, on a mounting substrate, having a plurality of holes, with a predetermined standoff between the package substrate and the mounting substrate, comprising:
    an insertion portion inserted in one of the plurality of holes in the mounting substrate; and
    a standoff portion to contact and support the package substrate such that the standoff portion has a height, equivalent to the predetermined standoff, on the mounting substrate and enables displacement of the package substrate relative to the mounting substrate,
    wherein the plurality of mutually isolated standoff members are arranged separately from the semiconductor device and the insertion portion and the standoff portion are integrally formed and a diameter of the standoff portion which contacts the package substrate is larger than a diameter of one of the plurality of holes in the mounting substrate; and
    wherein the standoff portion of each standoff member has a flat and smooth surface that contacts against the bottom surface of the package substrate and supports the package substrate so as to allow the package substrate horizontally movable when the solder bumps are fused.

9. The standoff member according to claim 8 wherein the standoff portion has a flat, smooth contact surface which contacts the package substrate.

10. The standoff member according to claim 8 wherein the insertion portion has a tapered portion at a leading edge of the insertion portion.

11. An electronic device according to claim 8, wherein:
the insertion portion is insertable by axial sliding movement into the hole and establishes a fixed height equivalent to the pre-determined standoff.

12. A method of manufacturing an electronic device in which a semiconductor device having a package substrate with solder bumps on a bottom surface of the package substrate and the semiconductor device is bonded to a mounting substrate, having a plurality of holes, with a predetermined standoff between the package substrate of the semiconductor device and the mounting substrate, the method comprising:

providing a plurality of mutually isolated standoff members which are arranged separately from each other and which comprise an insertion portion insertable into one of the plurality of holes in the mounting substrate, and a standoff portion to contact and support the package substrate;

wherein the plurality of mutually isolated standoff members are arranged separately from the semiconductor device, and the insertion portion and the standoff portion are integrally formed and a diameter of the standoff portion which contacts the package substrate is larger than a diameter of one of the plurality of holes in the mounting substrate and such that the standoff portion has a height, equivalent to the predetermined standoff, on the mounting substrate and enables displacement of the package substrate relative to the mounting substrate;

inserting the insertion portion inserted in one of the plurality of holes of standoff member into the hole of the mounting substrate;

disposing the package substrate on the mounting substrate so that the package substrate contacts the standoff portion of the standoff member; and performing a heating process with the standoff member interposed between the package substrate and the mounting substrate so that the semiconductor device is bonded to the mounting substrate by flip-chip bonding; and wherein the standoff portion of each standoff member has a flat and smooth surface that contacts against the bottom surface of the package substrate and supports the package substrate so as to allow the package substrate horizontally movable when the solder bumps are fused.

13. The method according to claim 12, further comprising:
supplying successive standoff members on an embossed tape to deposit a standoff member in each hole provided therefor in the mounting substrate.

14. The method according to claim 13, wherein:
the inserting the standoff member is performed by sliding the standoff member axially into the hole of the mounting substrate.

* * * * *